US009450589B2

(12) United States Patent
Feldman et al.

(10) Patent No.: US 9,450,589 B2
(45) Date of Patent: Sep. 20, 2016

(54) CLOCK GENERATION SYSTEM WITH DYNAMIC DISTRIBUTION BYPASS MODE

(71) Applicant: Intel Corporation, Santa Clara, CA (US)

(72) Inventors: Allan Feldman, Portland, OR (US); Nasser Kurd, Portland, OR (US); Mark Neidengard, Beaverton, OR (US); Vaughn Grossnickle, Beaverton, OR (US); Praveen Mosalikanti, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/126,005

(22) PCT Filed: Jun. 28, 2013

(86) PCT No.: PCT/US2013/048580
§ 371 (c)(1),
(2) Date: Dec. 13, 2013

(87) PCT Pub. No.: WO2014/209365
PCT Pub. Date: Dec. 31, 2014

(65) Prior Publication Data
US 2015/0214959 A1 Jul. 30, 2015

(51) Int. Cl.
*H03L 7/08* (2006.01)
*H03K 5/15* (2006.01)
*G06F 1/04* (2006.01)
*H03L 7/06* (2006.01)
(Continued)

(52) U.S. Cl.
CPC ............ *H03L 7/0802* (2013.01); *G06F 1/04* (2013.01); *G06F 1/10* (2013.01); *H03K 5/15* (2013.01); *H03L 7/06* (2013.01); *H03L 7/08* (2013.01); *H03L 7/083* (2013.01)

(58) Field of Classification Search
CPC ........ H03K 3/012; H03K 3/014; H03K 5/04; H03K 5/1565; H03K 7/08; H03K 21/08; H03L 7/14; H03L 7/16; H03L 7/093; H03L 7/101; H03L 7/145
USPC ......................................... 327/156, 158, 161
See application file for complete search history.

(56) References Cited

U.S. PATENT DOCUMENTS 5,428,317 A * 6/1995 Sanchez ............... H03K 3/0315
331/1 A
6,211,740 B1 * 4/2001 Dai .......................... G06F 1/08
331/14
(Continued)

FOREIGN PATENT DOCUMENTS

JP 2007-336003 A 12/2007
KR 10-2009-0097454 A 9/2009

OTHER PUBLICATIONS

International Search Report / Written Opinion for PCT Patent Application No. PCT/US2013/048580, mailed on Mar. 27, 2014, 9 pages.

(Continued)

*Primary Examiner* — John Poos
(74) *Attorney, Agent, or Firm* — Green, Howard & Mughal LLP

(57) ABSTRACT

In some embodiments, a tight loop mode is provided is which most, if not all of, the clock distribution circuitry may be bypassed during an initial frequency lock stage.

22 Claims, 3 Drawing Sheets

(51) Int. Cl.
   *G06F 1/10*    (2006.01)
   *H03L 7/083*   (2006.01)

(56) References Cited

U.S. PATENT DOCUMENTS

| | | |
|---|---|---|
| 8,188,766 B1 | 5/2012 | Cheah et al. |
| 2005/0078783 A1* | 4/2005 | Okita ................ H03L 7/087 375/376 |
| 2005/0200390 A1 | 9/2005 | Starr et al. |
| 2007/0159223 A1* | 7/2007 | Wang et al. ............ 327/156 |
| 2011/0304371 A1 | 12/2011 | Ravi et al. |

OTHER PUBLICATIONS

International Preliminary Report on Patentability mailed on Jan. 7, 2016 for International Patent Application No. PCT/US2013/048580.

* cited by examiner

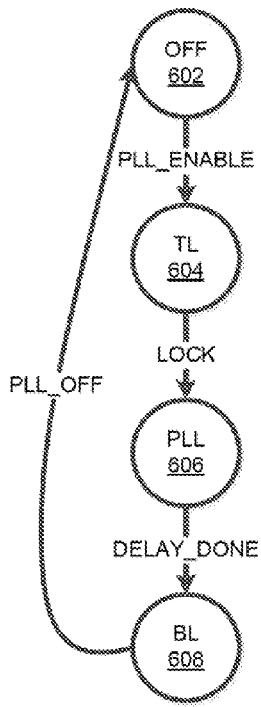
FIG. 6
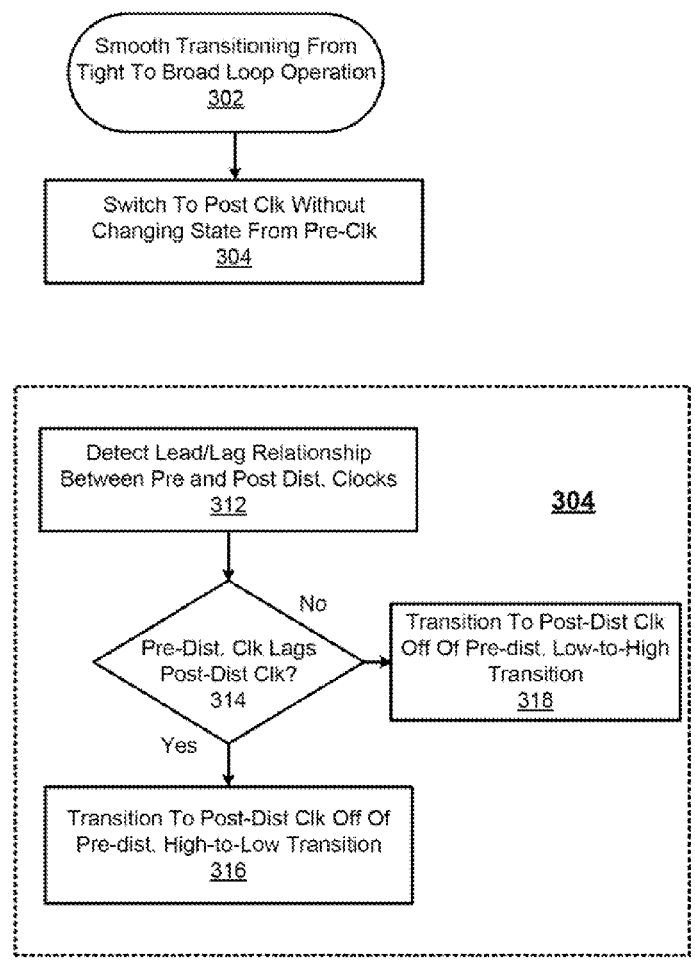
FIG. 3A
FIG. 3B

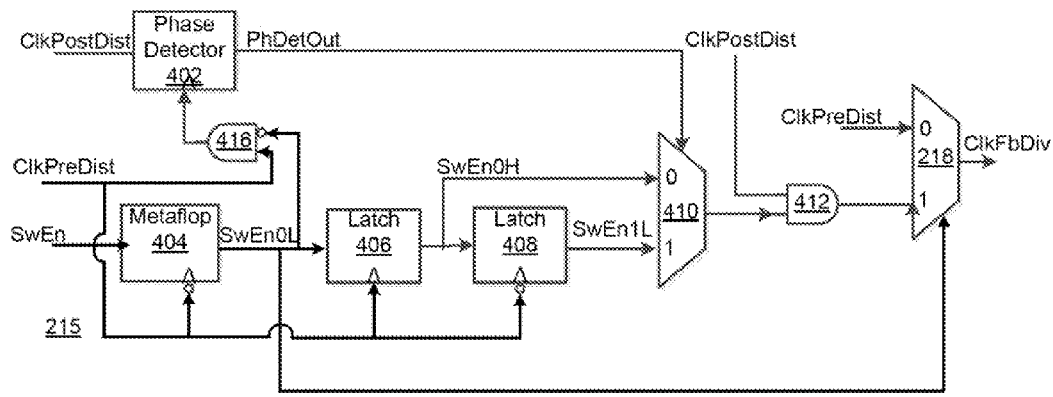
FIG. 4
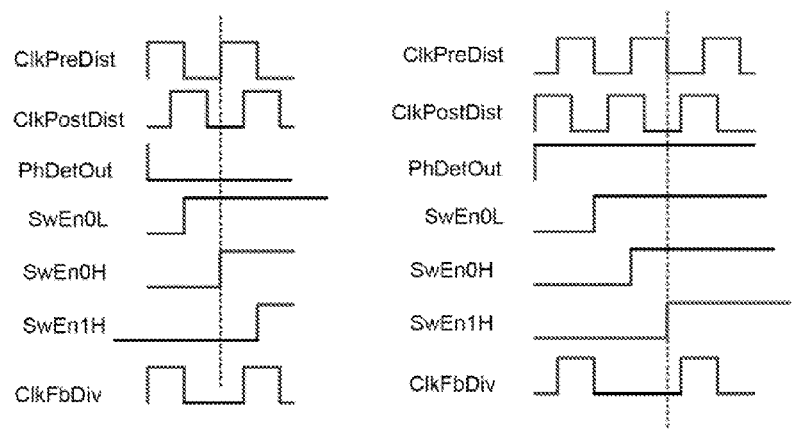
FIG. 5A  FIG. 5B

CLOCK GENERATION SYSTEM WITH DYNAMIC DISTRIBUTION BYPASS MODE

CLAIM OF PRIORITY

This application claims priority to PCT Patent Application Serial No. PCT/US2013/048580, filed on 28 Jun. 2013 and titled "CLOCK GENERATION SYSTEM WITH DYNAMIC DISTRIBUTION BYPASS MODE," which is incorporated by reference in its entirety.

BACKGROUND

FIG. 1 shows a typical clock generator system for a processing chip such as a multi-core server or swart phone chip. It includes a phase locked loop (PLL) 102, a clock distribution circuit 104, and a feedback divider (FB Divider) 106. The PLL generates a clock and provides it to the clock distribution circuit 104, controlling its output (Clk Out) so that its frequency and phase track an input reference (Ref) clock, albeit multiplied in accordance with the FB Divider ratio. That is, the Clk Out frequency will typically equal the Ref Clk frequency multiplied by the FB Divider value. So, for example, if the FB Divider 106 commutes a Div/8 circuit then the Clk Out frequency would be 8 times that of the Ref Clk.

The clock distribution circuit (sometimes referred to as a clock tree or the like) may include buffers and other digital and/or analog circuit blocks for distributing multiple outputs of the clock produced by the PLL. Depending upon the application, as well as on design considerations, the clock distribution circuit, in whole or in part, may or may not be on the same chip as the PLL.

In many cases, the PLL is started under strong bias conditions in order to achieve stable oscillation with reasonable lock times. The strong bias condition typically corresponds with an initial high frequency output. For example, the operational reference clock may be at 2 GHz, but the PLL might start at around 5 GHz. Unfortunately, since the initial PLL frequency is high, the distribution circuit 104 is typically over-designed to operate with such high frequencies. For example, the clock distribution circuit may require larger devices or higher supply levels for the clock distribution supply since the PLL will not lock if the supply voltage is below the point that can support the initial PLL high-frequency condition. The clock distribution loading may also cause spikes on the PLL if the voltage supply of she PLL is coupled the voltage supply of the clock distribution. This can cause extended lock time and instability, e.g., should a resonance condition be introduced due to the supply droop and subsequent correction.

Accordingly solutions to these and other problems may be desired.

BRIEF DESCRIPTION OF THE DRAWINGS

Embodiments of the invention are illustrated by way of example, and not by way of limitation, in the figures of the accompanying drawings in which like reference numerals refer to similar elements.

FIGS. 3A and 3B are flow diagrams illustrating methods for implementing dynamic feedback path switching in accordance with some embodiments.

FIG. 4 is a diagram showing a circuit for implementing a dynamic switching circuit in accordance with some embodiments.

FIGS. 5A and 5B are signal diagrams showing relevant signals for the dynamic switching circuit of FIG. 4 in accordance with some embodiments.

FIG. 6 is a state diagram illustrating a process for powering up the PLL and clock distribution circuits in accordance with some embodiments.

DETAILED DESCRIPTION

In some embodiments, a tight loop mode is provided in which most, if not all of, the clock distribution circuitry may be bypassed, during an initial frequency lock stage. This can allow for the PLL to be started, and brought to lock, while the clk distribution power is being ramped. Among other things, this means that the PLL startup frequency need not be limited by the bandwidth of the clk distribution circuit, and thus, the supply voltage requirements for the clock distribution circuit may be reduced. That is, the clock distribution circuit does not have to be deigned to support the initial PLL frequency. Among other things, this can reduce device power by allowing for the use of lower leakage devices and over supply levels in the clk distribution circuit. In addition, shorter lock time can be achieved since the distribution latency may be bypassed during initial PLL tight loop lock. Another benefit is that startup current spikes may be reduced. Furthermore, even if start-up conditions are not in issue, in some embodiments, disclosed dynamic switching techniques may be used for dynamically switching within and/or between different clock loads end clock load combinations without having to de-activate the PLL clock source.

Figure 1:
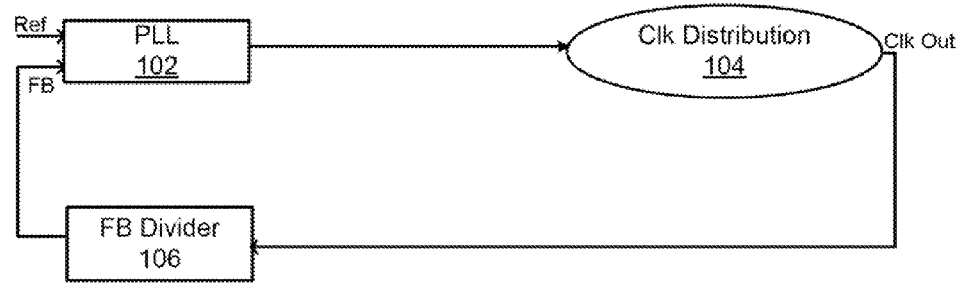
FIG. 1 is a diagram, showing a conventional clock generator system.
Figure 2:
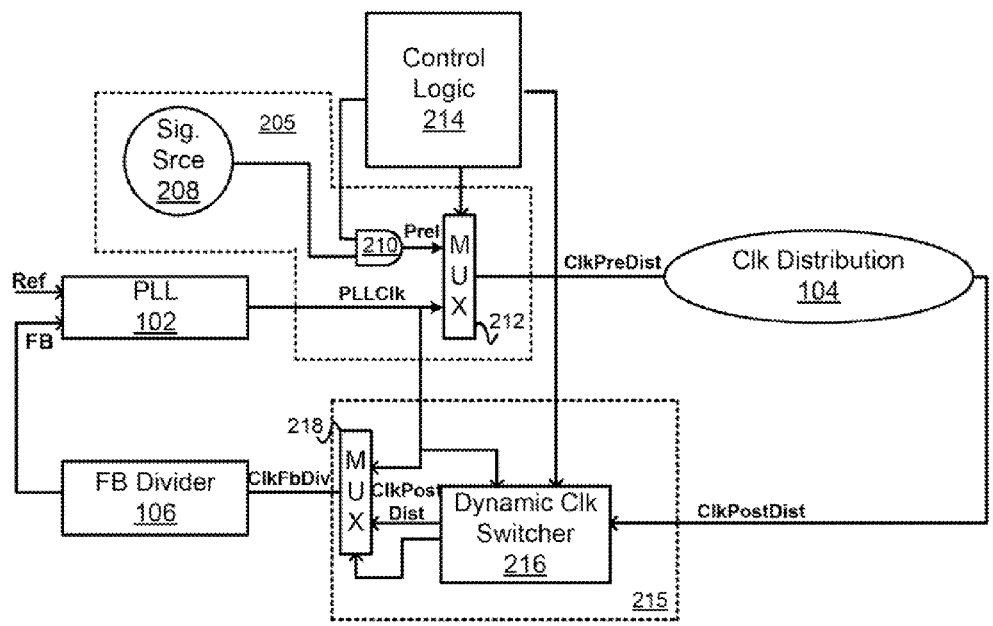
FIG. 2 is a block diagram of a PLL and clock distribution circuit with a clock distribution bypass mode in accordance with some embodiments.

FIG. 2 shows a block diagram of a PLL and clock distribution circuit with a clock distribution bypass mode in accordance with some embodiments. It includes PLL 102, clock distribution load (a.k.a. clk dist., clk load or PLL load) 104 and an FB divider 106, such as those described in FIG. 1. It further includes a pre-distribution switch circuit 205, control logic 214, and post distribution switch circuit 215, all coupled together as shown.

The pre-distribution switch circuit 205 functions to couple either the PLL Clk output (PLLClk) or a preliminary (Prel) signal to an input (ClkPreDist) of the Clk Dist circuit 104. The PLL output is used during normal operation as input to the clock distribution circuitry. while the Prel. signal may be used for a printing mode to precharge the clock dist. circuit when it is powered up.

In the depicted embodiment the pre-distribution switch circuit 205 includes a signal source 208, AND gate 210, and multiplexer (Mux.) 212, coupled as shown. The mux, 212 is controlled by control logic 312 to select for coupling to the Clk Dish circuit either the Prel. or PLL signal. The signal source 208 corresponds to any suitable signal source such as a ring oscillator, signal line, clk source, switching digital source, or any other desired signal source, depending upon its intended purpose with respect to the clk dist circuit 104. In some embodiments, a signal source may not even be used. The AND gate 210 functions as a switch to engage the signal source with, or disengage it from, the Prel. input of the mux. 212.

The post-distribution switch circuit 315 includes dynamic clock switcher 216 and multiplexer 218. The multiplexer operates to select between the input (ClkPreDist) and output (ClkPostDist) of the Clk Dist. circuit 104 for coupling to the FB Divider 106. (The ClkPreDist signal may also be referred to as "pre dist. clk" or "pre clk." Likewise, the ClkPostDist may also be referred to as "post dist. clk" or "post clk.") The mux. 218 is controlled by the dynamic clock switcher 216, which is controlled by control logic 214. The dynamic clock switcher may include, or be part of any suitable combination of logic elements to switch from the pre dist clk to the post clk without causing a problematic glitch and/or delay on the FB and/or the CLkFbDiv lines, depending on particular implementations and design concerns. For example, it may be desirable to limit glitches on the ClkFbDiv line to avoid errors resulting in the PLL "unlocking" e.g., if the FB Divider 106 comprises a counter or the like that could be adversely affected by a glitch. (Note that as used herein, the terms "feedback line" and "feedback path" are meant to generally encompass any part of a feedback path between the dynamic switcher and the FB input of the PLL. It may or may not include feedback blocks such as the feedback divider 106. Along these lines, it should be appreciated that the post clk may be tapped from any desirable point in a clock distribution circuit. In the depicted figure, it is shown tapped from the end of the clk distribution circuit, but it could alternatively be tapped from within the circuit at any suitable clock signal node.)

FIG. 3 is a flow diagram illustrating a routine for implementing a dynamic switcher 218 to perform smooth transitioning from a tight loop operation (clk distribution load bypassed) to a broad loop operation, with the clk disc load engaged within the PLL control loop. At 304, the clock for the feedback path (ClkFbDiv) is switched from the pre clk to the post clk without changing state, and thus, without inducing a significant (if any at all) glitch. The post and pre clocks are expected to have the same frequency when the PLL, in tight loop, is locked. Using this information, the static positions of the pre clk relative to the post clk can be assessed and used to make a smooth transition from the pre clk to the post clk.

In some embodiments, the dynamic clk switcher 216 essentially tracks the two clocks (pre and post clks) and causes the mux, 218 to select the post clk when it is (or will be) at the same state as the pre clk when the pre clk is deselected (disengaged from the feedback path) so as to avoid causing a glitch on the ClkFBDiv line. In some embodiments, it does this at a sufficient time so that an excessive frequency jumps, or delays, at the ClkFbDiv line are avoided. For example, it could switch from a High pre clk state to a High post clk state, or it could switch from a Low pre clk state to a Low post clk state. It could even switch from when the pre clk is at one state to the post clk when at a different state, so long as the timing is controlled to avoid detrimental delays or glitches. Note that there may or may not be a significant delay from when the pre clk is disengaged to when the post clk is engaged. On the other hand, if there is a not insubstantial delay, e.g., because of inherent or imposed delay, they may be at different states at the moment when the post clk is engaged. In some embodiments, with this situation, the dynamic switching circuitry could employ a circuit to "bridge the transition", e.g., maintain the feedback path at the target state, e.g., the state of the pre clk when disengaged and that of the post clk when engaged.

FIG. 3B shows a methodology for implementing 304 with dynamic switching circuitry in accordance with some embodiments where a Low state is to be maintained during the transition horn the pre clk to the post clk. At 312, the relative phase relationship between the pre clk and post clk is determined. That is, it is determined whether the pre clk leads, or lags, the post clk. At 314, if the pre clk lap the post clk, then the process proceeds to 316. This results in the transition to the post clk being keyed off of a pre clk High-to-Low transition. With the post clk leading, this should ensure that the post clk will be at a Low state. Otherwise, if the pre clk leads the post clk, then at 314, the process proceeds instead to 318, and the transition to post clk occurs off of a pre clk Low-to-High transition, when the post clk is at a Low state.

FIG. 4 stows a circuit for implementing a dynamic switcher 216 in accordance with some embodiments. With this embodiment, the ClkFbDiv line is to be kept Low during the transition to the post clk. FIGS. 5A and 5B are signal diagrams showing relevant signals for the dynamic switcher of FIG. 4 when the feedback path, is to be switched horn the pre clk to the post clk, which is enabled through the assertion of an enable (SwEn) signal. FIG. 5A illustrates the case when the pre clk leads the post clk, while FIG. 58 shows the case when the pre clk lags the post clk.

The depicted switcher circuit of FIG. 4 includes phase detector 402, metaflop (metastability resistant flip-flop) 404, latches 400, 408, mux. 410, and AND gates 412, 416, coupled together, and to mux. 218, as shown. It may be assumed that the pre and post clocks are running, i.e., that the PLL output is driving the clk dist circuit 104 and so it may be assumed that the pre and post clocks have the same frequency.

The feedback line transition from pre to post clk is initiated when the SwEn signal asserts (High). This causes the metaflop output (SwEn0L) to go High, which locks the phase detector 402 with an output (PhDetOut) result that reflects whether the pre clk leads or lags the post clk. If the pre clk leads, then PhDetOut is Low, but if it lags, then PhDetOut is High, (Among other things, metaflop 404 serves to synchronise the SwEn signal with the pre clk. It should be appreciated that any suitable logic circuit may be used to implement a phase detector, metaflop or the like. They function similarly, and it should be appreciated that any suitable combination of latches, flops, gates, and the like may be used to implement suitable phase detectors, metaflops, etc.)

If PhDetOut is Low (pre clk leading post clk), then the '0 path at mux. 410 is selected. This is tapped off of the output (SwEn0H) of latch 406. On the other hand, the '1 input of mux. 410 is selected if PhDetOut is High (when the pre clk lags the post clk). SwEn0H goes from Low to High when the pre clk goes from Low to High (once SwEn has been asserted High), conversely, SwEn1L transitions to a High when the pre clk goes from High to Low. (Note that metaflop 404, latch 406, and latch 408 are triggered off of Low, High and Low states, respectively. This means that the SwEn High assertion will progressively work its way through these devices with each pre clk half-cycle transition.)

Thus, AND gate 412 couples the post clk to the post clk input of mux, 218 off of a pre clk Low-to-High transition when the pre clk leads the post clk and oil of a pre clk High-to-Low transition when the pre clk lags the post clk. (Note that mux. 218 is selected when SwEn0L went High. So, the mux. is actually switched slightly ahead of the post clk being coupled to the feedback line. During this albeit brief interim, the AND gate 212 maintains the ClkFbDiv Low until the post clk is engaged, by either SwEn0H or SwEn1L.) The dashed line in FIGS. 5A and 5B corresponds to the time when the post clk is actually engaged as the feedback line (ClkFbDiv). As can be seen, a glitch does not occur because ClkFbDiv stays Low while the line is transitioned from the pre to the post clk. There is a slight phase error introduced by the switch, but it is guaranteed to be limited to 1 cycle. Note that In the case of setup time violations (pre and post clocks are marginally aligned), a clock switch can chop part of the clock during the switch but the chop time would be bounded by the setup time of the phase detector.

FIG. 6 shows a process for powering up the PLL and clock distribution circuit for operating the system in a broad loop mode. For example, this process could be implemented in, or overseen by, control logic 214. In some embodiments, the voltage supply of the clock distribution circuit and the voltage supply of the PLL may be decoupled from each other so that they may be independently powered up and/or primed apart from one another.

At 602, both the PLL and distribution circuit are off. The PLL is then activated, finally locking in a tight loop mode (distribution circuit bypassed) at 604. During the PLL state (604), the Clk Dist circuit 104 may be powered up, with the signal source 208 applied through mux. 212 to the clk dist. circuit 104. Once the PLL has locked (in tight loop), it is selected at mux. 212 to be led into the clk dist circuit instead of the signal source 208. During this state (606), the routine may wait for a preset amount of time before switching to the PLL clock, e.g., "X" clock cycles, possibly set by fuses for example. Alternatively, a "ready" signal indicating PLL lock could be used to pause the PLL clock to be fed into the distribution circuit.

The transition from 606 to 608 corresponds to when the post clk dist. output is switched into the feedback path. Finally, the routine settles at state 608 (broad loop mode) for steady-state operation.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration, within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines. should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips end other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be web within purview of one skilled in the art. Where specific details (e.g., circuits) are set forth in order to describe example embodiments of the invention. It should be apparent to one skilled in the art that the invention can be practiced without, or with variation of, these specific details. The description, is thus to be regarded as illustrative instead of limiting.

What is claimed is:

1. An apparatus, comprising:
  a PLL (phase locked loop) circuit to generate a PLL clock at a PLL clock output, the PLL circuit having a feedback path input coupled to an input of a divider;
  a clock distribution circuit switchably coupled to the PLL clock output to generate a post clock off of the PLL clock; and
  a switch circuit capable of dynamically switching between the PLL clock and the post clock to be coupled to the feedback path input while the PLL circuit is generating a clock output.

2. The apparatus of claim 1, in which the switch circuit is to switch freely between tight loop and broad loop modes after the PLL circuit powers up.

3. The apparatus of claim 2, in which the clock distribution circuit is switchably coupled to a clock distribution priming signal, wherein said priming signal is to be initially coupled to the clock distribution circuit followed by the PLL clock output being coupled to the clock distribution circuit once the PLL circuit has powered up.

4. The apparatus of claim 1, wherein the switch circuit is to switch from the PLL clock to the post clock without generating a state-transition glitch on the feedback path input.

5. The apparatus of claim 4, wherein the switch circuit has phase detection circuitry to cause the transition from the PLL clock to the post clock based on whether the post clock leads or lags the PLL clock.

6. The apparatus of claim 5, in which the transition occurs off of a PLL clock Low-to-High transition if the PLL clock leads the post clock.

7. The apparatus of claim 1, in which the PLL and clock distribution circuits have separate power supplies.

8. An apparatus, comprising:
a Phase Locked Loop (PLL);
a clock distribution load to be coupled to the PLL; and
control logic which is operable to:
startup the PLL with the clock distribution load decoupled from the PLL,
power up the clock distribution load while the PLL is starting up,
couple the clock distribution load to the PLL once the PLL has locked, and
switch a feedback path of the PLL from a pre distribution circuit clock (pre clk) to a post distribution circuit clock (post clk) without deactivating the PLL.

9. The apparatus of claim 8, in which the PLL and the clock distribution load are in separate chips.

10. The apparatus of claim 8, wherein the feedback path is switched through a dynamic switch circuit.

11. The apparatus of claim 10, in which the dynamic switch circuit includes circuitry to switch to the post clk when the post clk is at a Low state.

12. The apparatus of claim 10, in which the dynamic switch circuit includes circuitry to maintain the feedback path at the same state during transition from the pre clk to the post clk.

13. The apparatus of claim 8, in which the clock distribution load comprises a plurality of clock buffers to provide multiple clocks.

14. The apparatus of claim 8, in which the feedback path includes a feedback divider circuit.

15. An apparatus, comprising:
a PLL (phase locked loop) circuit to generate a PLL clock, the PLL circuit having a feedback input coupled to an input of a divider;
a clock distribution circuit to be switchably coupled to a PLL clock output to generate a post clock from the PLL clock; and
a switch circuit to dynamically switch from the PLL clock to the post clock as input to the feedback input.

16. The apparatus of claim 15, in which the switch circuit is to select the PLL clock when the PLL circuit is powered up and is next to select the post clock for a broad loop operation once both the PLL and clock distribution circuits have powered up.

17. The apparatus of claim 16, in which the clock distribution circuit is switchably coupled to a clock distribution priming signal, wherein said priming signal is to be initially coupled to the clock distribution circuit followed by the PLL clock output being coupled to the clock distribution circuit once the PLL circuit has powered up.

18. The apparatus of claim 15, wherein the switch circuit is to switch from the PLL clock to the post clock without generating a state-transition glitch on the feedback input.

19. The apparatus of claim 18, wherein the switch circuit has phase detection circuitry to cause the transition from PLL clock to post clock based on whether the post clock leads or lags the PLL clock.

20. A method, comprising:
with a clock system having a phase locked loop (PLL) and a clock load to be switchably coupled to the PLL to be driven by the PLL, locking the PLL without the clock load being coupled to a feedback path input to a divider of the PLL; and
dynamically switching the clock load into the feedback path without unlocking the PLL.

21. The method of claim 20, in which locking the PLL includes initially powering the PLL so that the PLL starts at a higher frequency than when it is locked and coupled to the clock load.

22. The method of claim 20, in which switching the clock load into the feedback path includes controlling a multiplexer to switch from an output of the PLL to an output of the clock load.

* * * * *